US008853702B2

(12) United States Patent
Jin et al.

(10) Patent No.: US 8,853,702 B2
(45) Date of Patent: Oct. 7, 2014

(54) ORGANIC LIGHT EMITTING DIODE DISPLAY AND METHOD FOR REPAIRING ORGANIC LIGHT EMITTING DIODE DISPLAY

(75) Inventors: Guang hai Jin, Yongin (KR); Jae-Beom Choi, Yongin (KR); Kwan-Wook Jung, Yongin (KR); June-Woo Lee, Yongin (KR); Moo-Jin Kim, Yongin (KR); Hee-Kyung Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 12 days.

(21) Appl. No.: 13/616,654

(22) Filed: Sep. 14, 2012

(65) Prior Publication Data

US 2013/0256676 A1  Oct. 3, 2013

(30) Foreign Application Priority Data

Mar. 30, 2012 (KR) .................. 10-2012-0033397

(51) Int. Cl.
*H01L 27/14* (2006.01)
*H01L 29/08* (2006.01)
*H01L 29/10* (2006.01)
*H01L 31/00* (2006.01)

(52) U.S. Cl.
USPC ............. 257/72; 257/40; 257/43; 257/59

(58) Field of Classification Search
CPC .............. H01L 27/3262; H01L 2251/568
USPC .................. 257/72, 40, 43, 59; 438/34
See application file for complete search history.

(56) References Cited

U.S. PATENT DOCUMENTS

| 2001/0019133 | A1* | 9/2001 | Konuma et al. | 257/79 |
| 2004/0018797 | A1* | 1/2004 | Murakami et al. | 445/24 |
| 2005/0082534 | A1* | 4/2005 | Kim et al. | 257/72 |
| 2008/0121872 | A1* | 5/2008 | Choi et al. | 257/40 |
| 2009/0039353 | A1* | 2/2009 | Jun et al. | 257/72 |
| 2010/0193790 | A1* | 8/2010 | Yeo et al. | 257/59 |
| 2011/0114956 | A1* | 5/2011 | Park et al. | 257/59 |
| 2012/0074388 | A1* | 3/2012 | Park et al. | 257/40 |

FOREIGN PATENT DOCUMENTS

| KR | 10-2002-0008321 A1 | 1/2002 |
| KR | 10-0667089 B1 | 1/2007 |

* cited by examiner

*Primary Examiner* — Long K Tran
*Assistant Examiner* — Dzung Tran
(74) *Attorney, Agent, or Firm* — Lee & Morse, P.C.

(57) ABSTRACT

An organic light emitting diode (OLED) display includes a first electrode, an organic emission layer positioned on the first electrode, and a second electrode positioned on the organic emission layer. The OLED display includes a substrate, a thin film transistor including an active layer positioned on the substrate, a gate electrode positioned on the active layer and formed with the same layer as the first electrode, and a source electrode and a drain electrode positioned on the gate electrode and connected to the active layer, a pixel defining layer positioned between the source electrode and the drain electrode, and the second electrode, the pixel defining layer including a pixel opening exposing the first electrode and a pin hole opening exposing at least one of the source electrode and the drain electrode; and a coated portion filling the pin hole opening.

11 Claims, 7 Drawing Sheets

ORGANIC LIGHT EMITTING DIODE DISPLAY AND METHOD FOR REPAIRING ORGANIC LIGHT EMITTING DIODE DISPLAY

CROSS-REFERENCE TO RELATED APPLICATION

This application claims priority to and the benefit of Korean Patent Application No. 10-2012-0033397 filed in the Korean Intellectual Property Office on Mar. 30, 2012, the entire contents of which are incorporated herein by reference.

BACKGROUND

1. Field

The described technology relates generally to an organic light emitting diode (OLED) display and a repair method of an OLED display. More particularly, the described technology relates generally to an OLED display of a bottom light emitting structure and a repairing method of an OLED display.

2. Description of the Related Art

An OLED display has been recently developed as a display device for displaying images. An OLED display has a self emissive characteristic and differs from a liquid crystal display (LCD) in that it does not require a separate light source. Moreover, the OLED display has a relatively small thickness and weight. Furthermore, the OELD display exhibits high quality characteristics such as low power consumption, high luminance, and short response time.

A conventional OLED display may include a first electrode, a second electrode positioned on the first electrode, and an organic emission layer positioned between the first electrode and the second electrode.

SUMMARY

Embodiments are directed to an organic light emitting diode (OLED) display including a first electrode, an organic emission layer positioned on the first electrode, and a second electrode positioned on the organic emission layer, the OLED display including a substrate, a thin film transistor including an active layer positioned on the substrate, a gate electrode positioned on the active layer and formed with the same layer as the first electrode, and a source electrode and a drain electrode positioned on the gate electrode and connected to the active layer, a pixel defining layer positioned between the source electrode and the drain electrode, and the second electrode, the pixel defining layer including a pixel opening exposing the first electrode and a pin hole opening exposing at least one of the source electrode and the drain electrode, and a coated portion filling the pin hole opening.

The pixel defining layer may be the only layer positioned between the source electrode and the second electrode and between drain electrode and the second electrode.

The coated portion may include an organic material.

The coated portion may protrude from the pixel defining layer.

The coated portion and the pixel defining layer may include different materials.

The first electrode may be a light transmission electrode, and the second electrode may be a light reflective electrode.

Embodiments are also directed to a method for repairing an organic light emitting diode (OLED) display including forming an active layer on a substrate, forming a gate electrode on the active layer and forming a first electrode with a same layer as the gate electrode, forming a source electrode and a drain electrode on the gate electrode, the source electrode and the drain electrode being connected to the active layer, forming a pixel defining layer on the source electrode and the drain electrode, the pixel defining layer including a pixel opening exposing the first electrode, identifying a pin hole formed at the pixel defining layer in a location corresponding at least one of the source electrode and the drain electrode, forming a pin hole opening by opening the pin hole to expose at least one of the source electrode and the drain electrode, and filling the pin hole opening with a coated portion.

The forming of the pin hole opening may be performed by using a laser.

The method may further include forming an organic emission layer at the pixel opening, and forming a second electrode on the organic emission layer and the pixel defining layer.

The filling of the pin hole opening with the coated portion may be performed by coating the pin hole opening with an organic material.

The filling of the pin hole opening with the coated portion may be performed such that coated portion protrudes from the pixel defining layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
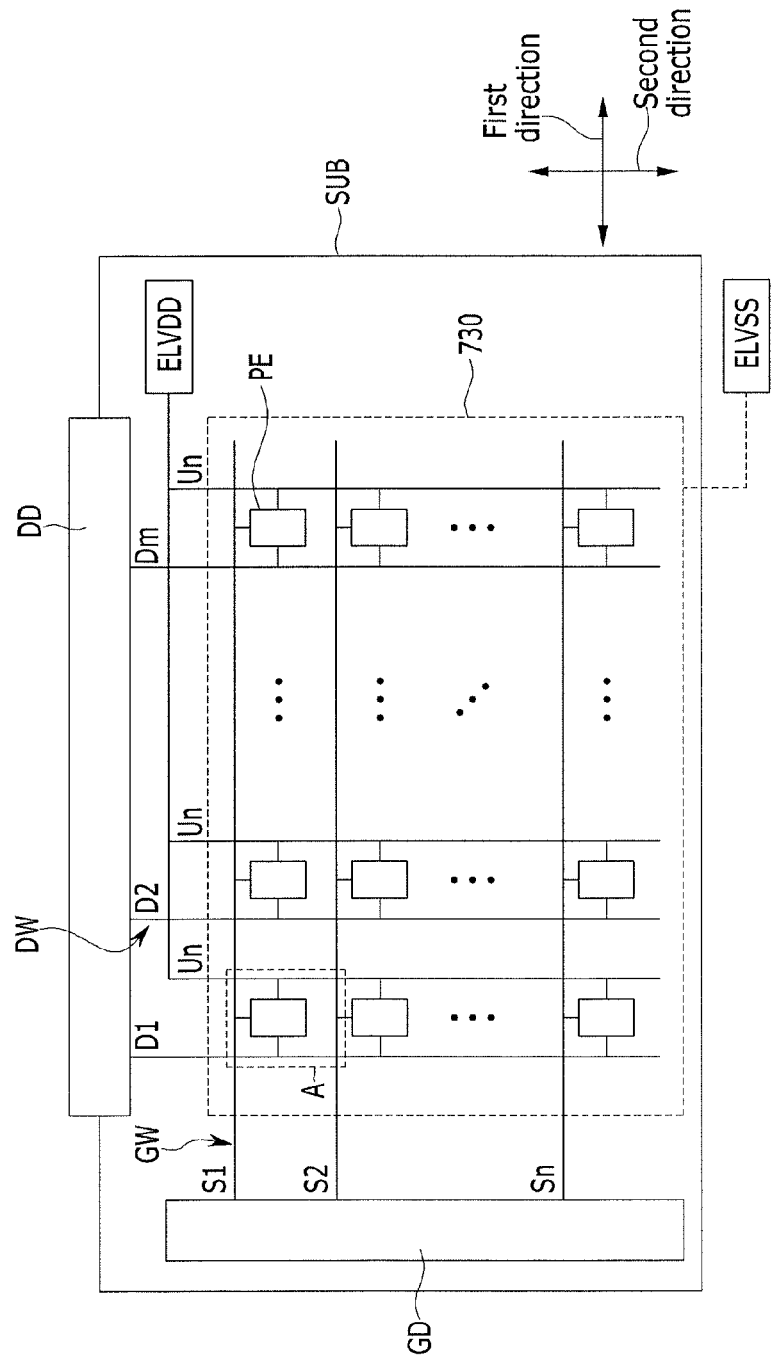
FIG. 1 illustrates a view of an OLED display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

For greater clarity, parts that are not relevant to the description may be omitted. The same elements or equivalents are referred to by the same reference numerals throughout the specification. The size and thickness of each element are arbitrarily shown in the drawings, and the thickness of layers, films, panels, regions, etc., may be exaggerated for clarity. Moreover, it is to be understood that when an element such as a layer, film, region, or substrate is referred to as being "on" another element, such element may be directly on the other element, or intervening elements may also be present.

In addition, unless explicitly described to the contrary, the word "comprise" and variations such as "comprises" or "comprising" will be understood to imply the inclusion of stated elements but not the exclusion of any other elements. Also, throughout the specification, "on" means that an element is positioned on or above or under or below another element, and does not necessarily mean that an element is positioned at an upper side of another element based on a gravity direction.

Further, the attached drawings illustrate the active matrix (AM) display device having a 2Tr-1Cap structure in which a pixel has two thin film transistors (TFTs) and one capacitor, but it is to be understood that other structures are possible. In other implementations, the OLED display may include at least three thin film transistors and at least two capacitors for each pixel, and may further include additional wiring for various configurations. In this instance, the pixel represents a minimum unit for displaying an image, and the OLED display expresses the image through a plurality of pixels.

An OLED display according to an exemplary embodiment will be described with reference to FIG. 1 to FIG. 3. FIG. 1 is a view of the OLED display according to the exemplary embodiment.

As shown in FIG. 1, the OLED display according to the exemplary embodiment may include a substrate SUB, a gate driver GD, gate wires GW, a data driver DD, data wires DW, and a pixel PE. As noted above, the term "pixel" may refer to a minimum unit for displaying an image. The OLED display displays the image through a plurality of pixels PE.

The substrate SUB may be a transparent light transmission substrate made of glass, quartz, ceramic, or plastic. In other implementations, the substrate SUB may be a metallic substrate made of stainless steel. If the substrate SUB is made of plastic, the OLED display may be flexible or may be rolled.

The gate driver GD may sequentially supply a scan signal to the gate wires GW corresponding to a control signal supplied by a control circuit (not shown), for example, a timing controller. The pixel PE may be selected by the scan signal to sequentially receive a data signal.

Figure 3:
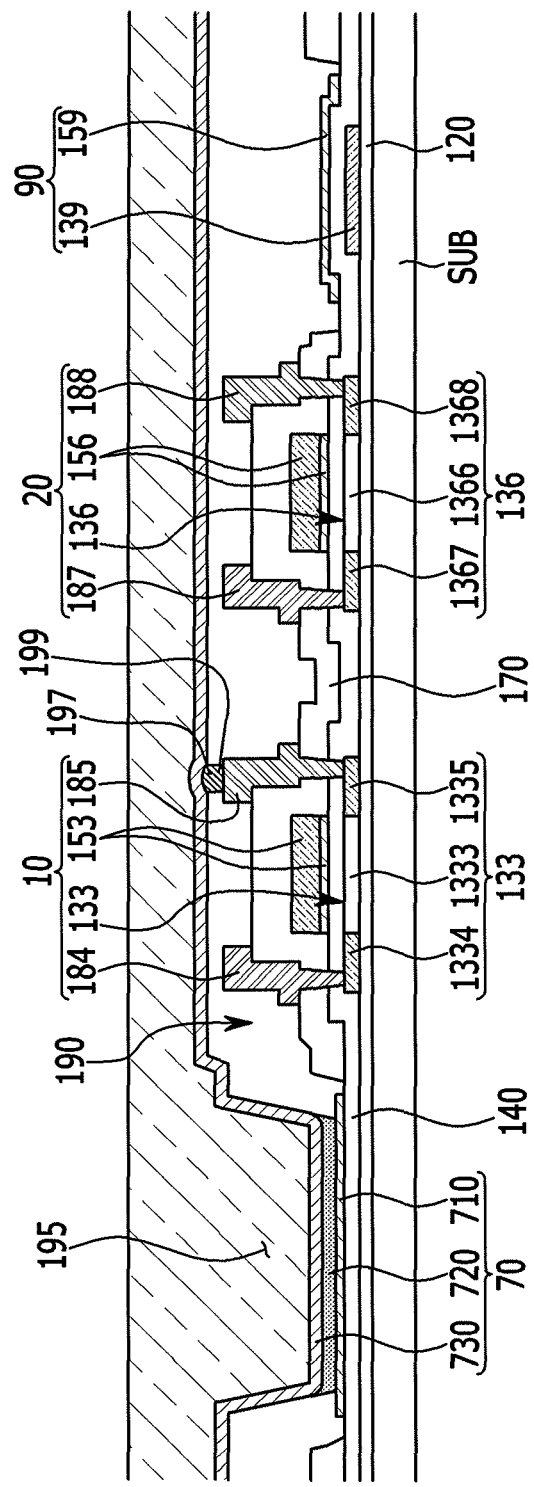
FIG. 3 illustrates a cross-sectional view taken along the line of FIG. 2.

The gate wires GW may be provided on the substrate SUB with a first insulation layer 140 shown in FIG. 3, and may extend in a first direction. The gate wires GW may include scan lines S1-Sn that are connected to the gate driver GD to receive a scan signal from the gate driver GD.

The gate wires GW of the OLED display according to the exemplary embodiment may include the scan line Sn. The gate wires of an OLED display according to other implementations may further include an additional scan line, a reset power line, and an emission control line. In this case, the OLED display may be an active matrix (AM) organic light emitting OLED display having, for example, a 6Tr-2Cap structure.

The data driver DD may supply a data signal to a data line Din from among the data wires DW corresponding to a control signal supplied by the timing controller. The data signal supplied to the data line Dm may be supplied to the pixel PE selected by the scan signal each time the scan signal is supplied to the scan line Sn. The pixel PE may be charged with a voltage corresponding to the data signal and may emit light with a corresponding luminance.

The data wires DW may be provided on the gate wires GW with a second insulation layer 170 therebetween, as shown in FIG. 3. The data wires DW may extend in a second direction to cross the first direction. The data wires DW may include the data lines D1-Dm and a drive power line Un. The data line Dm may be connected to the data driver DD and may receive the data signal from the data driver DD. The drive power line Un may be connected to an external first power source ELVDD, and may receive drive power from the first power source ELVDD.

The pixel PE may be provided at points where the gate wires GW cross the data wires DW and may be connected to the gate wires GW and the data wires DW. The pixel PE may include thin film transistors and a capacitor connected to the first power source ELVDD, the gate wires GW, and the data wires DW, and an organic light emitting diode connected between the thin film transistors and a second power source ELVSS. The pixel PE may be selected when the scan signal is supplied through the scan line Sn. The pixel PE charges the voltage corresponding to the data signal through the data line Dm, and emits light with predetermined luminance corresponding to the charged voltage. The pixel PE will be described in detail below with reference to FIG. 2.

Figure 2:
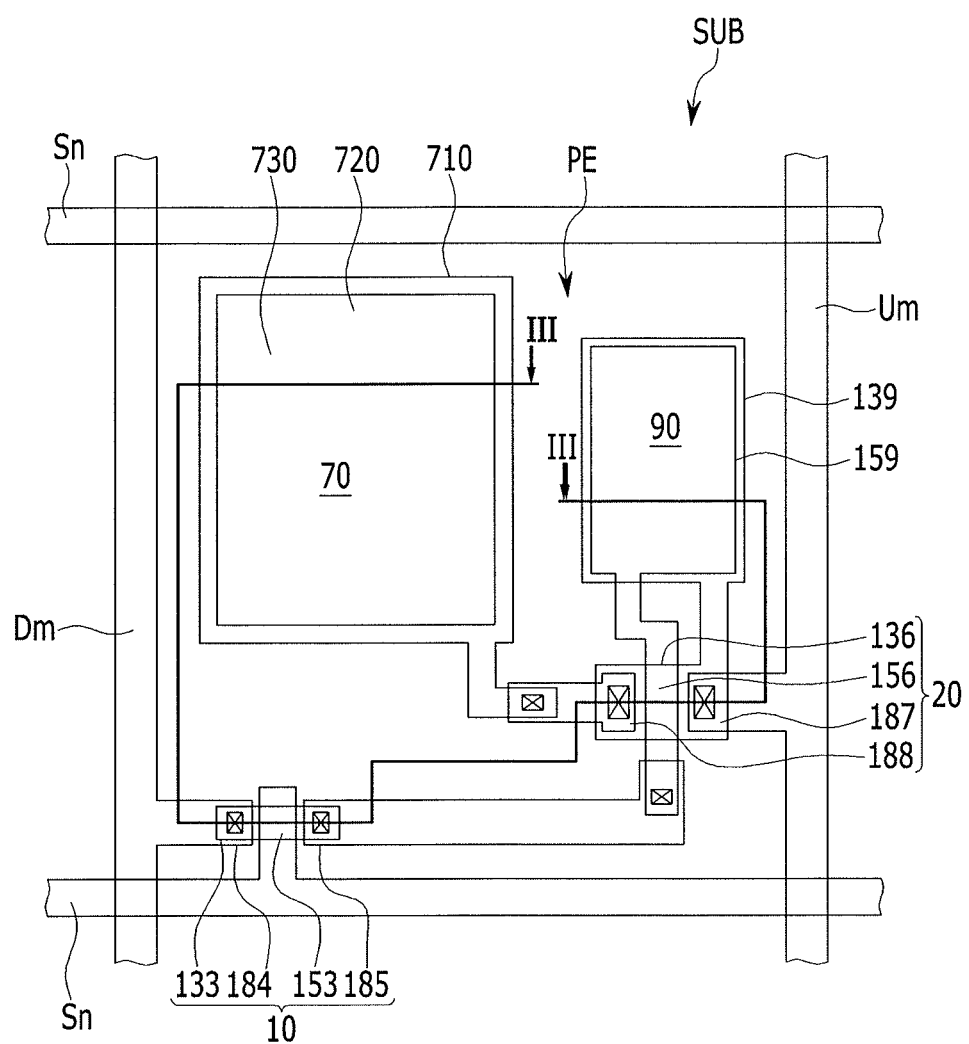
FIG. 2 illustrates a layout view of a portion A of FIG. 1.

FIG. 2 is a layout view of a part A of FIG. 1. As shown in FIG. 2, a pixel PE may have a 2Tr-1Cap structure in which an organic light emitting diode 70, two TFTs 10 and 20, and a capacitor 90 are disposed. However, in other implementations, the pixel PE may have a configuration in which at least three thin film transistors and at least two capacitors are disposed.

In detail, in the exemplary embodiment, the OLED display may include a switching thin film transistor 10 and a driving thin film transistor 20 for one pixel PE. The switching thin film transistor 10 and the driving thin film transistor 20 respectively include gate electrodes 153 and 156, active layers 133 and 136, source electrodes 184 and 187, and drain electrodes 185 and 188.

The source electrode 184 of the switching thin film transistor 10 may be connected to the data line Dm, and the gate electrode 153 of the switching thin film transistor 10 may be connected to the scan line Sn. A node may be formed between the drain electrode 185 of the switching thin film transistor 10 and the capacitor 90, so that the drain electrode 185 of the switching thin film transistor 10 may be connected to a first capacitor electrode 139 of the capacitor 90. Also, the drain electrode 185 of the switching thin film transistor 10 may be connected to the gate electrode 156 of the driving thin film transistor 20. The drive power line Un may be connected to the source electrode 187 of the driving thin film transistor 20, and the first electrode that is the anode of the organic light emitting diode 70 may be connected to the drain electrode 188.

The switching thin film transistor 10 may be used as a switch for selecting the pixel PE to emit light. When the switching thin film transistor 10 is turned on, the capacitor 90 is instantly charged, and the amount of the charge is in proportion to the voltage applied from the data line Dm. While the switching thin film transistor 10 is turned off, a gate potential of the second thin film transistor 20 rises according to the potential charged in the capacitor 90. The driving thin film transistor 20 is turned on when the gate potential exceeds a threshold voltage. The voltage applied to the drive power line Un is applied to the organic light emitting diode 70 through the driving thin film transistor 20, and the organic light emitting diode 70 emits light.

The organic light emitting diode 70 may include a first electrode 710 that is an anode functioning as a hole injection electrode, a second electrode 730 that is a cathode functioning as an electron injection electrode, and an organic emission layer 720 disposed between the first electrode and the second electrode.

The first electrode 710 may be a light transmission electrode or a light translucent electrode, and the light emitted from the organic emission layer 720 may be recognized at the outside through the substrate SUB while passing through the first electrode 710.

The organic emission layer 720 is positioned between the first electrode 710 and the second electrode 730, as a portion emitting the light as described above. A hole injection layer and a hole transport layer may be positioned between the organic emission layer 720 and the first electrode 710, and an electron injection layer and an electron transport layer may be positioned between the organic emission layer 720 and the second electrode 730. Also, the hole injection layer, the hole transport layer, the electron injection layer, and the electron transport layer may be positioned throughout the entire surface of the OLED display corresponding to the second electrode 730.

The second electrode 730 is disposed on the organic emission layer 720, and as shown in FIG. 1, may be formed throughout the entire surface of the OLED display with a plate shape. The second electrode 730 may be a light reflective electrode, and the light emitted from the organic emission layer 720 may be reflected by the second electrode 730 and irradiated into the side of the first electrode 710, thereby being recognized outside through the substrate SUB. That is, the OLED display according to the exemplary embodiment may have a bottom light emitting structure.

Next, referring to FIG. 3, the structure of the pixel PE of the OLED display according to the exemplary embodiment will be described in detail according to the deposition sequence.

FIG. 3 is a cross-sectional view taken along the line III-III of FIG. 2. As shown in FIG. 3, a buffer layer 120 may be formed on the substrate SUB. The buffer layer 120 may be formed as a single layer or as multiple layers including at least one insulating layer such as a silicon oxide layer and a silicon nitride layer. The buffer layer 120 may be formed by a chemical vapor deposition method or a physical vapor deposition method. The buffer layer 120 may be a light transmission insulation layer.

The buffer layer 120 may prevent the diffusion or penetration of moisture or impurities into the substrate SUB, may smooth the surface, and may control a heat transmission speed during a crystallization process for forming an active layer.

The buffer layer 120 may be omitted depending on the type of substrate SUB and process conditions.

The active layers 133 and 136 and the first capacitor electrode 139 may be formed on the buffer layer 120. As an example, the active layers 133 and 136 and the first capacitor electrode 139 may be formed by forming an amorphous silicon layer on the buffer layer 120, crystallizing the same, forming a polysilicon film, and patterning the polysilicon film. If desired, the first capacitor electrode 139 may be formed with a material that is different from that of the active layers 133 and 136.

The first insulation layer 140 may be formed on the active layers 133 and 136 and the first capacitor electrode 139. In detail, the first insulation layer 140 may be formed to cover the active layers 133 and 136 and the first capacitor electrode 139 on the buffer layer 120. The first insulation layer 140 may be formed by including at least one of various insulating materials such as tetraethyl orthosilicate (TEOS), silicon nitride ($SiN_x$), and silicon oxide ($SiO_2$), for example. The first insulation layer 140 may be a light transmission insulation layer.

The gate electrodes 153 and 156, the first electrode 710, and a second capacitor electrode 159 may be formed on the same layer as the scan lines Si to Sn and the gate wires GW, and may be formed with the same material on the first insulation layer 140. The gate electrodes 153 and 156 may be formed on the active layers 133 and 136 so that they may be overlapped on channel regions 1333 and 1366 of the active layers 133 and 136. The active layers 133 and 136 may include the channel regions 1333 and 1366 to which no impurity is doped, and source regions 1334 and 1367 and drain regions 1335 and 1368 that are disposed on respective sides of the channel regions 1333 and 1366 and to which an impurity is doped. The gate electrodes 153 and 156 may prevent the impurity from being doped to the channel regions 1333 and 1366 while the impurity is doped to form the source regions 1334 and 1367 and the drain regions 1335 and 1368. Also, the impurity may be doped to the first capacitor electrode 139 while the impurity is doped to the source regions 1333 and 1366 and the drain region of the active layers 133 and 136.

Further, the gate electrodes 153 and 156 may be formed with double layers including a gate transparent layer and a gate metal layer that is formed on the gate transparent layer. The gate metal layer may be formed to include at least one of various suitable metallic materials such as molybdenum (Mo), chromium (Cr), aluminum (Al), silver (Ag), titanium (Ti), tantalum (Ta), and tungsten (W). The gate transparent layer may include at least one transparent conductive material such as indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The first electrode 710 may be formed on a same layer with the same material as the gate transparent layers of the gate electrodes 153 and 156.

Also, the second capacitor electrode 159 may be formed at the same position as the first electrode 710 and the gate electrodes 153 and 156, as an example. The second capacitor electrode 159 may be formed with the same layer as the source electrodes 184 and 187 and the drain electrodes 185 and 188.

A second insulation layer 170 may be formed on the gate electrodes 153 and 156. The second insulation layer 170 may be formed with a sufficient thickness to acquire stable interlayer insulation. The second insulation layer 170 may not be formed on the first electrode 710. That is, the second insulation layer 170 may be formed to reveal the first electrode 710.

A plurality of conductive wires 184, 185, 187, 188, and 189 may be formed on a same layer as the data lines D1 to Dm that form the data wires DW. The plurality of conductive wires 184, 185, 187, 188, and 189 may be formed with the same material on the second insulation layer 170. The conductive wires may include source electrodes 184 and 187 and drain electrodes 185 and 188. The conductive wires may further include a data line Dm and a drive power line Un.

Further, the conductive wires 184, 185, 187, 188, and 189 may be formed by including at least one of various suitable metallic materials in a like manner as the gate electrodes 153 and 156.

The source electrodes 184 and 187 and the drain electrodes 185 and 188 may contact the source regions 1334 and 1367 and the drain regions 1335 and 1368 of the active layers 133 and 136 through contact holes that are formed in the first insulation layer 140 and the second insulation layer 170.

A pixel defining layer 190 may be positioned on the plurality of conductive wires 184, 185, 187, and 188. The pixel defining layer 190 may be positioned on the source electrodes 184 and 187 and the drain electrodes 185 and 188 as the data lines D1 to Dm. The pixel defining layer 190 may include a pixel opening 195 for revealing a part of the first electrode 710, and a pin hole opening 197 for revealing a part of the drain electrode 185. The pixel defining layer 190 may be formed of various suitable organic materials. For example, the pixel defining layer 190 may be patterned to be a photo-sensitive organic layer, and may be formed after being cured by heat or light. The pin hole opening 197 formed in the pixel defining layer 190 may be formed in at least one electrode of the source electrode 184 and 187 and the drain electrode 185 and 188, and may expose at least one of the source electrodes 184 and 187 and the drain electrodes 185 and 188. A coated portion 199 is positioned in the pin hole opening 197.

The coated portion 199 fills the pin hole opening 197 and may protrude from the pixel defining layer 190 while filling the pin hole opening 197. The coated portion 199 may be formed with various suitable organic materials and may be formed of a different organic material from the pixel defining layer 190.

The organic emission layer 720 may be formed on the first electrode 710, and the second electrode 730 may be formed on the organic emission layer 720. The first electrode 710, organic emission layer 720, and the second electrode 730 form the organic light emitting element 70. The second electrode 730, as described above, may be formed throughout the entire surface of the OLED display. Thereby, the pixel defining layer 190 may be positioned between the source electrodes 184 and 187 and the drain electrodes 185 and 188, and the second electrode 730. That is, there may be nothing else but the pixel defining layer 190 between the source electrodes 184 and 187 and the second electrode 730 and between the drain electrodes 185 and 188 and the second electrode 730. The pixel opening 195 of the second insulation layer 190, on which the first electrode 710, the organic emission layer 720, and the second electrode 730 are sequentially stacked, may be defined as a light-emitting region of the organic light emitting element 70 where the organic emission layer 720 is positioned.

The OLED display according to the exemplary embodiment may be a bottom light emitting type. In other implementations, the OLED display may be a front light emitting type. In this case, the first electrode may be formed of the light reflective electrode, and the second electrode may be formed as a light transmission electrode or a light translucent electrode.

As described above, in the OLED display according to the exemplary embodiment, only the pixel defining layer 190 is positioned between the source electrodes 184 and 187 and the second electrode 730 and between the drain electrodes 185 and 188 and the second electrode 730. If an undesired pin hole is generated at a portion of the region of the pixel defining layer 190 corresponding to the source electrodes 184 and 187 and the drain electrodes 185 and 188 in the manufacturing process, then, according to the method described herein, the pin hole opening 197 may be formed at the region where the pin hole is formed and the coated portion 199 may be positioned at the pin hole opening 197, thereby preventing a short-circuit between the source electrodes 184 and 187 and the second electrode 730 and between the drain electrodes 185 and 188 and the second electrode 730. Accordingly, the manufacturing yield may be improved. That is, in the particular bottom light emitting structure of the OLED display in which only the pixel defining layer 190 is positioned between the source electrodes 184 and 187 and the second electrode 730 and between the drain electrodes 185 and 188 and the second electrode 730, although an undesired pin hole may be formed in the pixel defining layer 190 at a location corresponding to one of the source electrodes 184 and 187 and the drain electrodes 185 and 188 during the manufacturing process of the bottom light emitting structure, the pin hole opening 197 may be formed in the pin hole and the coated portion 199 may fill the pin hole opening 197, Thereby, a short-circuit between the source electrodes 184 and 187 and the second electrode 730 and between the drain electrodes 185 and 188 and the second electrode 730 may be prevented.

Next, referring to FIG. 4 to FIG. 7, the repairing method of the OLED display according to the exemplary embodiment will be described.

Figure 4:
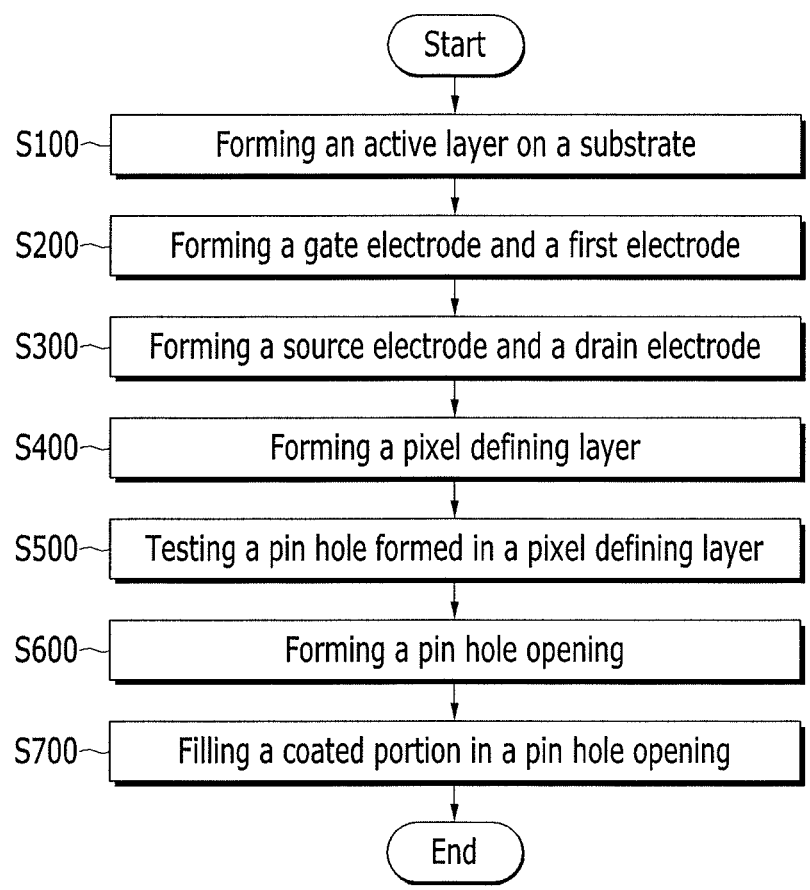
FIG. 4 illustrates a flowchart of a repairing method of an OLED display according to another exemplary embodiment.
Figure 5:
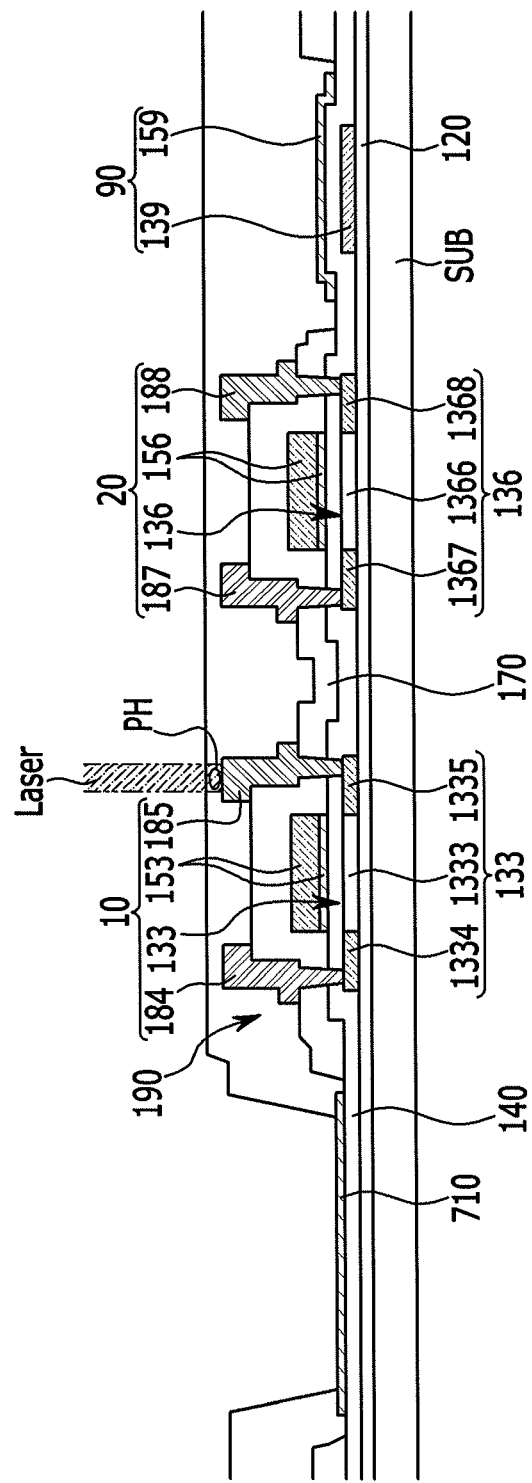
FIG. 5 to FIG. 7 illustrate views to explain a repairing method of an OLED display according to the exemplary embodiment of FIG. 4.
Figure 6:
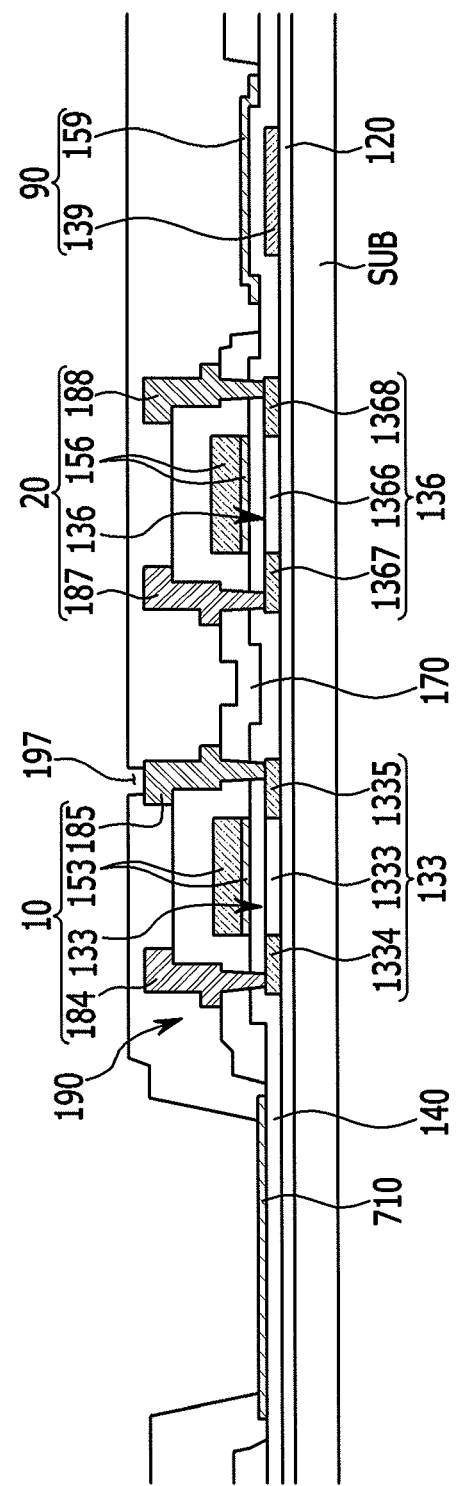
Figure 7:
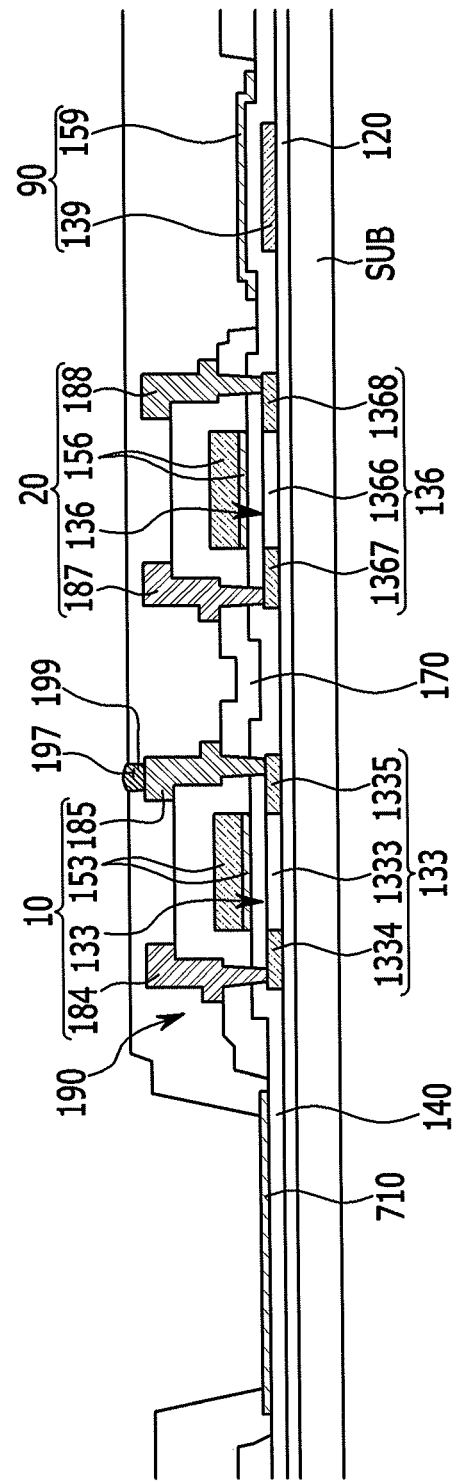

FIG. 4 is a flowchart of a repairing method of an OLED display according to the exemplary embodiment. FIG. 5 to FIG. 7 are views to explain a repairing method of an OLED display according to the exemplary embodiment.

As shown in FIG. 4 and FIG. 5, active layers 133 and 136 may be formed on a substrate SUB (S100). In detail, a buffer layer 120 may be formed on the substrate SUB and an amorphous silicon layer may be formed thereon. Next, after crystallizing the amorphous silicon layer to form a polysilicon layer, the polysilicon layer may be patterned to form the active layers 133 and 136 and the first capacitor electrode 139.

Next, gate electrodes 153 and 156 and the first electrode 710 may be formed (S200). In detail, the first insulation layer 140 may be formed on the active layers 133 and 136 and the first capacitor electrode 139. The gate electrode 153 and 156 including the gate transparent layer and the gate metal layer, the first electrode 710 including the gate transparent layer, and the second capacitor electrode 159 including the gate transparent layer may be formed on the first insulation layer 140. The gate electrode 153 and 156, the first electrode 710, and the second capacitor electrode 159 may be formed by one photolithography process, thereby being formed from the same layer. At this time, by using the gate electrodes 153 and 156 as a mask, impurities may be doped to source regions 1334 and 1367 and drain regions 1335 and 1368 of the active layers 133 and 136.

Next, the source electrodes 184 and 187 and the drain electrodes 185 and 188 may be formed (S300). In detail, the second insulation layer 170 may be formed on the gate electrode 153 and 156, and the source electrodes 184 and 187 and the drain electrodes 185 and 188 may be formed on the second insulation layer 170. Before forming the source electrodes 184 and 187 and the drain electrodes 185 and 188, contact holes may be formed in the first insulation layer 140 and the second insulation layer 170. The source electrodes 184 and 187 and the drain electrodes 185 and 188 may be connected to the source regions 1334 and 1367 and the drain regions 1335 and 1368 of the active layers 133 and 136.

Next, the pixel defining layer 190 may be formed (S400). In detail, after forming a photosensitive organic layer on the entire surface of the substrate SUB to cover the first electrode 710, the source electrodes 184 and 187, and the drain electrodes 185 and 188, the photosensitive organic layer may be exposed and developed by using a mask to expose the first electrode 710, thereby forming the pixel defining layer 190 including the pixel opening 195.

At this time, the thickness of the pixel defining layer 190 at locations corresponding to the source electrodes 184 and 187 and the drain electrodes 185 and 188 may be thinner than the other portions of the pixel defining layer 190. A pin hole may be inadvertently generated in pixel defining layer in at least one of the locations corresponding to the source electrodes 184 and 187 and the drain electrodes 185 and 188.

Next, the pixel defining layer 190 is tested to determine the existence of the pin hole (S500). In detail, the front surface of the pixel defining layer 190 may be tested by using a testing device such as an optical microscope to examine the pixel defining layer 190 for the existence of a pin hole PH in the pixel defining layer 190. In the repair method of the OLED display according to the exemplary embodiment, the pin hole PH may be generated at a portion of the pixel defining layer 190 corresponding to the drain electrode 185. However, the repair method of the OLED display according to another exemplary embodiment, may be applied when the pin hole PH is formed at a portion of the pixel defining layer 190 corresponding to at least one electrode among the source electrodes 184 and 187 and the drain electrodes 185 and 188, these being portions where the pixel defining layer 190 is thinner than at other portions.

Next, as shown in FIG. 6, the pin hole opening 197 may be formed by using a laser (S600). In detail, by irradiating the laser to the pixel defining layer 190 where the pin hole PH has been generated, the pin hole opening 197 exposing the portion of the drain electrode 185 and 188 may be formed. The laser may be an Nd:YAG UV laser and may have a wavelength range of 30 nm to 200 nm.

Next, as shown in FIG. 7, the pin hole opening 197 may be filled in with the coated portion 199 (S700). In detail, an organic material may be coated into the pin hole opening 197 and may be hardened to fill the pin hole opening 197 with the coated portion 199. By coating the organic material into the pin hole opening 197 for the coated portion 199 to protrude from the pixel defining layer 190, the coated portion 199 may be formed to protrude from the pixel defining layer 190.

Next, as shown in FIG. 3, the organic emission layer 720 may be formed in the pixel opening 195. In detail, the organic emission layer 720 may be formed at the pixel opening 195 by using a mask. As desired, a hole injection layer, hole transport layer, electron injection layer, and electron injection layer (EIL) may also be formed in the pixel opening 195, and the hole injection layer, the hole transport layer, the electron injection layer, and the electron injection layer may be positioned between the second electrode 730 and the pixel defining layer 190 through the substrate SUB as well as the pixel opening 195.

Next, the second electrode 730 may be formed on the organic emission layer 720 and the pixel defining layer 190. In detail, the second electrode 730 may be formed on the entire substrate SUB.

As described above, in forming the OLED display, the thickness of the portion of the pixel defining layer 190 corresponding to the source electrodes 184 and 187 and the drain electrodes 185 and 188 on the bottom light emitting structure may be thinner than other portions of the pixel defining layer 190 such that a pin hole PH may be inadvertently generated in the manufacturing process. In the repair method according to the exemplary embodiment, the pin hole opening 197 may be formed at the pin hole PH by using a laser, and the coated portion 199 may fill the pin hole opening 197. Accordingly, even when an undesired pin hole PH is formed at the portion of the pixel defining layer 190 corresponding to the source electrode 184 and 187 and the drain electrode 185 and 188 in the manufacturing process, a short-circuit between the source electrode 184 and 187 and the drain electrode 185 and 188, and the second electrode 730 may be thereby prevented.

By way of summation and review, an OLED display of a bottom light emitting structure in which the first electrode and the gate electrode of the thin film transistor are formed with the same layer by reducing a number of masks has been developed. However, in the OLED display of the bottom light emitting structure, only one pixel insulation layer is formed between the source electrode and drain electrode of the thin film transistor, and the second electrode, such that at least one electrode of the source electrode and the drain electrode of the thin film transistor and the second electrode may be short-circuited when a pin hole is generated in one pixel insulation layer.

Exemplary embodiments may provide an OLED display in which an undesired pin hole formed at a pixel insulation layer in a manufacturing process is repaired, and a repairing method of an OLED display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display including a first electrode, an organic emission layer positioned on the first electrode, and a second electrode positioned on the organic emission layer, the OLED display comprising:
   a substrate;
   a thin film transistor including an active layer positioned on the substrate, a gate electrode including a gate transparent layer and a gate metal layer on the gate transparent layer, the gate transparent layer positioned on the active layer and formed with the same layer as the first electrode, and a source electrode and a drain electrode positioned on the gate electrode and connected to the active layer;
   a pixel defining layer positioned between the source electrode and the drain electrode, and the second electrode, the pixel defining layer including a pixel opening exposing the first electrode and a pin hole opening in the pixel defining layer and exposing at least one of the source electrode and the drain electrode; and
   a coated portion filling the pin hole opening.

2. The OLED display as claimed in claim 1, wherein the pixel defining layer is the only layer positioned between the source electrode and the second electrode and between drain electrode and the second electrode.

3. The OLED display as claimed in claim 1, wherein the coated portion includes an organic material.

4. The OLED display as claimed in claim 1, wherein the coated portion protrudes from the pixel defining layer.

5. The OLED display as claimed in claim 1, wherein the coated portion and the pixel defining layer include different materials.

6. The OLED display as claimed in claim 1, wherein:
   the first electrode is a light transmission electrode, and
   the second electrode is a light reflective electrode.

7. A method for repairing an organic light emitting diode (OLED) display, the method comprising:
   forming an active layer on a substrate;
   forming a gate electrode including a gate transparent layer and a gate metal layer on the gate transparent layer, the gate transparent layer formed on the active layer and forming a first electrode with a same layer as the gate transparent layer of the gate electrode;
   forming a source electrode and a drain electrode on the gate electrode, the source electrode and the drain electrode being connected to the active layer;

forming a pixel defining layer on the source electrode and the drain electrode, the pixel defining layer including a pixel opening exposing the first electrode;

identifying a pin hole formed at the pixel defining layer in a location corresponding at least one of the source electrode and the drain electrode;

forming a pin hole opening in the pixel defining layer and by opening the pin hole to expose at least one of the source electrode and the drain electrode; and filling the Pin hole opening with a coated portion.

8. The method as claimed in claim 7, wherein the forming of the pin hole opening is performed by using a laser.

9. The method as claimed in claim 7, further comprising:
forming an organic emission layer at the pixel opening; and
forming a second electrode on the organic emission layer and the pixel defining layer.

10. The method as claimed in claim 7, wherein
the filling of the pin hole opening with the coated portion is performed by coating the pin hole opening with an organic material.

11. The method as claimed in claim 7, wherein
the filling of the pin hole opening with the coated portion is performed such that coated portion protrudes from the pixel defining layer.

\* \* \* \* \*